(12) United States Patent
Chang et al.

(10) Patent No.: US 10,726,910 B2
(45) Date of Patent: Jul. 28, 2020

(54) DISTRIBUTED SINKING CIRCUIT CONTROL FOR MEMORY DEVICE

(71) Applicant: SanDisk Technologies LLC, Plano, TX (US)

(72) Inventors: Albert Chang, Santa Clara, CA (US); Khin Htoo, Sunnyvale, CA (US); Matt Chen, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 98 days.

(21) Appl. No.: 15/874,156

(22) Filed: Jan. 18, 2018

(65) Prior Publication Data

US 2018/0358087 A1   Dec. 13, 2018

Related U.S. Application Data

(60) Provisional application No. 62/518,593, filed on Jun. 13, 2017, provisional application No. 62/617,056, filed on Jan. 12, 2018.

(51) Int. Cl.

| | |
|---|---|
| *G11C 11/56* | (2006.01) |
| *H03L 7/089* | (2006.01) |
| *G11C 16/04* | (2006.01) |
| *G11C 17/12* | (2006.01) |
| *G11C 16/10* | (2006.01) |
| *G11C 7/12* | (2006.01) |
| *G11C 5/14* | (2006.01) |
| *G11C 5/06* | (2006.01) |
| *G11C 16/08* | (2006.01) |
| *G11C 13/00* | (2006.01) |
| *G11C 16/30* | (2006.01) |

(52) U.S. Cl.
CPC .......... *G11C 11/5628* (2013.01); *G11C 5/063* (2013.01); *G11C 5/14* (2013.01); *G11C 7/12* (2013.01); *G11C 16/0416* (2013.01); *G11C 16/102* (2013.01); *G11C 17/12* (2013.01); *H03L 7/0895* (2013.01); *G11C 13/0023* (2013.01); *G11C 13/0038* (2013.01); *G11C 16/08* (2013.01); *G11C 16/30* (2013.01)

(58) Field of Classification Search
CPC .......................... G11C 11/5228; G11C 5/063
USPC ...................................... 365/185.18
See application file for complete search history.

(56) References Cited

U.S. PATENT DOCUMENTS

| | | | | |
|---|---|---|---|---|
| 6,614,295 B2 * | 9/2003 | Tsuchi | ............... | H03F 3/505 327/541 |
| 7,477,557 B2 * | 1/2009 | Keeth | ............... | G11C 5/025 365/201 |
| 9,083,232 B1 * | 7/2015 | Agarwal | ............... | H03M 1/70 |
| 9,911,481 B1 * | 3/2018 | Alam | ............... | G11C 11/1655 |
| 2002/0101775 A1 | 8/2002 | Nojiri et al. | | |
| 2007/0206427 A1 | 9/2007 | Hirobe | | |

(Continued)

*Primary Examiner* — Hoai V Ho
*Assistant Examiner* — Muna A Techane
(74) *Attorney, Agent, or Firm* — Vierra Magen Marcus LLP

(57) ABSTRACT

Disclosed is a device including a sinking circuit to sink current from an output node and a driver circuit coupled to the sinking circuit. The driver circuit includes complementary differential pairs to receive a voltage at the output node and generate a control signal according to the received voltage. The sinking circuit is configured to change the current from the output node according to the control signal.

12 Claims, 10 Drawing Sheets

(56) References Cited

U.S. PATENT DOCUMENTS

| | | | |
|---|---|---|---|
| 2008/0117674 A1* | 5/2008 | Lee | G11C 5/147 |
| | | | 365/185.2 |
| 2009/0273998 A1 | 11/2009 | Mu | |
| 2010/0029234 A1* | 2/2010 | Joos | H03D 7/1441 |
| | | | 455/209 |
| 2011/0298541 A1* | 12/2011 | Shi | H03F 3/45183 |
| | | | 330/261 |

* cited by examiner

1000

```
┌─────────────────────────────────────┐
│ Track a voltage at a memory cell    │
│ based on a first differential pair  │
│ and a second differential pair      │
│ 1010                                │
└─────────────────────────────────────┘
                  │
                  ▼
┌─────────────────────────────────────┐
│ Adjust a transconductance of the    │
│ first differential pair with respect│
│ to the second differential pair     │
│ according to the voltage            │
│ 1020                                │
└─────────────────────────────────────┘
                  │
                  ▼
┌─────────────────────────────────────┐
│ Generate a control signal according │
│ to the adjusted transconductance    │
│ 1030                                │
└─────────────────────────────────────┘
```

FIG. 10

DISTRIBUTED SINKING CIRCUIT CONTROL FOR MEMORY DEVICE

CROSS-REFERENCE TO RELATED APPLICATIONS

The present application claims priority to U.S. Provisional Application No. 62/617,056 filed on Jan. 12, 2018, and U.S. Provisional Application No. 62/518,593 filed on Jun. 13, 2017, each of which is incorporated by reference herein in its entirety.

BACKGROUND

The following description is provided to assist the understanding of the reader. None of the information provided or references cited is admitted to be prior art.

The operation of memory devices includes the application of voltages or currents to memory cells. Writing data to the memory cells or reading the stored data includes applying different voltages at different phases. For example, various phases of writing data in a resistive memory device may include a set phase, a reset phase, a verification phase, a standby phase, etc. A bias control circuit may bias different components of the memory cells at corresponding voltages during different phases. To ensure correct operations of the memory devices, voltages from the bias control circuit may be settled within a settling time period during each phase. Increase in the settling time may cause delays in the operation speed of the memory devices.

SUMMARY

Various embodiments are related to a device including a sinking circuit to sink current from an output node, and a driver circuit coupled to the sinking circuit. The driver circuit includes complementary differential pairs to receive a voltage at the output node and generate a control signal according to the received voltage. The sinking circuit is configured to change the current from the output node according to the control signal.

In one or more embodiments, the complementary differential pairs include a first differential pair configured to receive the voltage at the output node within a first range of voltages, and a second differential pair configured to receive the voltage at the output node within a second range of voltages.

In one or more embodiments, the device further includes a balance controller coupled to the first differential pair and the second differential pair. The balance controller may be configured to increase a transconductance of the first differential pair with respect to the second differential pair in response to the voltage at the output node being in the first range, and decrease the transconductance of the first differential pair with respect to the second differential pair in response to the voltage at the output node being in the second range. The balance controller may include a steering transistor having a source terminal coupled to source terminals of the second differential pair, and a diode connected transistor having a gate terminal coupled to a drain terminal of the steering transistor and a gate terminal of a current control transistor. The current control transistor may be coupled to source terminals of the first differential pair.

In one or more embodiments, the first differential pair is an N-type differential pair, and the second differential pair is a P-type differential pair. The device may further include a first P-type current mirror circuit, wherein an input of the first P-type current mirror circuit is coupled to a first N-type transistor of the N-type differential pair. The device may further include a second P-type current mirror circuit, wherein an input of the second P-type current mirror circuit is coupled to a second N-type transistor of the N-type differential pair. The device may further include a first N-type current mirror circuit, wherein an input of the first N-type current mirror circuit is coupled to a first P-type transistor of the P-type differential pair. The device may further include a second N-type current mirror circuit, wherein an input of the second N-type current mirror circuit is coupled to a second P-type transistor of the P-type differential pair. The input of the second N-type current mirror circuit may be coupled to an output of the first P-type current mirror circuit, and the input of the second P-type current mirror circuit may be coupled to an output of the first N-type current mirror circuit. An output of the second N-type current mirror circuit may be coupled to an output of the second P-type current mirror circuit to output the control signal.

Various embodiments are related to a device including a distributed sinking circuit to sink current from a memory cell, and a driver circuit coupled to the distributed sinking circuit. The driver circuit includes a first differential pair configured to receive a voltage at the memory cell across a first range, and a second differential pair configured to receive the voltage at the memory cell across a second range. The driver circuit may be configured to generate a control signal based on the received voltage to change the current from the memory cell.

In one or more embodiments, the device further includes a balance controller coupled to the first differential pair and the second differential pair. The balance controller may be configured to increase a transconductance of the first differential pair with respect to the second differential pair in response to the voltage at the memory cell being in the first range, and decrease the transconductance of the first differential pair with respect to the second differential pair in response to the voltage at the memory cell being in the second range. The balance controller may include a steering transistor having a source terminal coupled to source terminals of the second differential pair, and a diode connected transistor having a gate terminal coupled to a drain terminal of the steering transistor and a gate terminal of a current control transistor. The current control transistor may be coupled to source terminals of the first differential pair.

In one or more embodiments, the first differential pair is an N-type differential pair, and the second differential pair is a P-type differential pair. The device may further include a first P-type current mirror circuit, an input of the first P-type current mirror circuit coupled to a first N-type transistor of the N-type differential pair. The device may further include a second P-type current mirror circuit, where an input of the second P-type current mirror circuit is coupled to a second N-type transistor of the N-type differential pair. The device may further include a first N-type current mirror circuit, where an input of the first N-type current mirror circuit is coupled to a first P-type transistor of the P-type differential pair. The device may further include a second N-type current mirror circuit, an input of the second N-type current mirror circuit coupled to a second P-type transistor of the P-type differential pair. The input of the second N-type current mirror circuit may be coupled to an output of the first P-type current mirror circuit, and the input of the second P-type current mirror circuit may be coupled to an output of the first N-type current mirror circuit. An output of the second N-type current mirror circuit may be coupled to an output of the second P-type current mirror circuit to output the control signal.

In one or more embodiments, the device further includes a pull up circuit coupled to the memory cell, a gate terminal of a transistor of the first differential pair, and a gate terminal of a transistor of the second differential pair. The pull up circuit may be configured to increase a voltage of the memory cell, while the distributed sinking circuit is disabled.

Various embodiments are related to a method including receiving a voltage at a memory cell based on a first differential pair configured to receive the voltage within a first range and a second differential pair configured to receive the voltage within a second range. The method also includes adjusting a transconductance of the first differential pair with respect to the second differential pair according to the voltage at the memory cell, and generating a control signal according to the adjusted transconductance of the first differential pair with respect to the second differential pair.

In one or more embodiments, the method further includes combining sensing results of the first differential pair and the second differential pair to generate the control signal.

In one or more embodiments, the method further includes increasing the transconductance of the first differential pair with respect to the second differential pair in response to determining that the voltage at the memory cell is within the first range, and decreasing the transconductance of the first differential pair with respect to the second differential pair in response to determining that the voltage at the memory cell is within the second range.

The foregoing summary is illustrative and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

FIG. 10 is an example flow chart illustrating a process of automatically adjusting a transconductance and generating a control signal according to an example embodiment.

Figure 1:
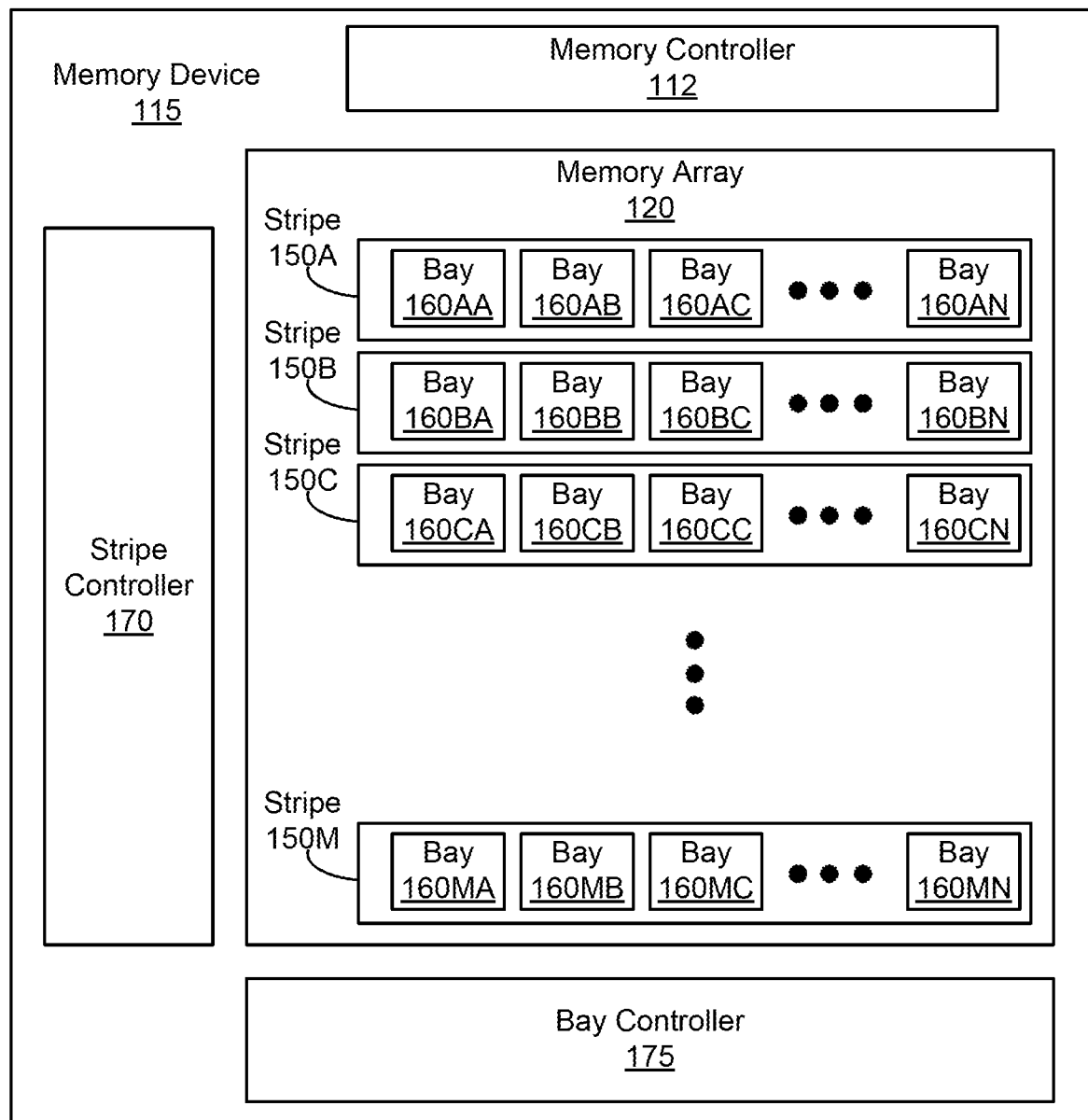
FIG. 1 is a block diagram of a memory device according to an example embodiment.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Various embodiments disclosed herein are related to distributed drivers and a driving circuit to control voltages or currents applied to memory cells.

Distributed drivers may provide voltages or currents to corresponding memory cells. A distributed driver (also referred to as "a distributed controller" herein) may be any circuit coupled to a specific set of corresponding memory cells to provide one or more voltages or currents to the memory cells. The distributed driver may receive a control signal, and generate one or more voltages or currents according to the control signal. The control signal is a signal indicative of a target voltage or a target current to be provided to memory cells. In an embodiment, a plurality of distributed drivers may be connected to a common controller that may provide a control signal. Each distributed driver provides one or more voltages or currents to a respective set of memory cells.

A driving circuit is a circuit that generates a control signal to control the distributed drivers. The driving circuit may include a plurality of differential pairs including a first differential pair configured to detect a first range of voltages, and a second differential pair configured to detect a second range of voltages. A differential pair is a circuit that receives differential inputs to compare a difference between the differential inputs. By employing the plurality of differential pairs, a wider range of voltage at the memory cells can be detected as compared to employing a single differential pair.

In one aspect, the driving circuit includes a balance controller coupled to the differential pairs. The balance controller is a circuit that adjusts a relative transconductance between the first differential pair and the second differential pair. A relative transconductance between the first differential pair and the second differential pair is a relative difference between a transconductance of the first differential pair and a transconductance of the second differential pair. For example, the balance controller increases a transconductance of the first differential pair, decreases a transconductance of the second differential pair, or both to improve sensing of the voltage performed by the first differential pair compared to the second differential pair. For another example, the balance controller decreases a transconductance of the first differential pair, increases a transconductance of the second differential pair, or both to improve sensing of the voltage performed by the second differential pair compared to the first differential pair. Advantageously, the balance controller can adjust the transconductance of the first differential pair and the transconductance of the second differential pair, such that a combination of the transconductance of the first differential pair and the transconductance of the second differential pair becomes substantially uniform for a wide range of the voltage at the memory cells. The uniform transconductance thus improves stability of the driving circuit.

FIG. 1 is a block diagram of one embodiment of a memory device 115. The memory device 115, in various embodiments, may be disposed in a computing device. In one embodiment, the memory device 115 includes a memory controller 112, a stripe controller 170, a bay controller 175, and the memory array 120. These components operate together to receive electronic data from a host processor (not shown), store the electronic data, and output the stored data to the host processor. In other embodiments, the memory device 115 includes more, fewer, or different components than shown in FIG. 1.

The memory array 120 is a component that stores electronic data. In one aspect, the memory array 120 is embodied as a semiconductor memory device including one or more volatile memory devices, such as dynamic random access memory (DRAM) or static random access memory (SRAM) devices, non-volatile memory devices, such as resistive random access memory (ReRAM), electrically erasable programmable read only memory (EEPROM), flash memory (which can also be considered a subset of EEPROM), ferroelectric random access memory (FRAM), and magnetoresistive random access memory (MRAM), other semiconductor elements capable of storing information, or some combination of them.

The memory array 120 includes a plurality of memory cells divided into bays 160 and stripes 150. A stripe 150 is a group of bays 160, where a bay 160 is a group of memory cells. The memory cells can be formed from passive and/or active elements, in any combinations. In a non-limiting example, passive semiconductor memory elements include ReRAM device elements, which in some embodiments include a resistivity switching storage element, such as an anti-fuse, phase change material, etc., and optionally a steering element, such as a diode, etc. Further, in another non-limiting example, active semiconductor memory elements include EEPROM and flash memory device elements, which in some embodiments include elements containing a charge storage region, such as a floating gate, conductive nanoparticles, or a charge storage dielectric material. The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may also be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

In a three dimensional NAND memory array, the memory elements may be coupled together to form a NAND string within a single horizontal (e.g., x-z) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

In a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic)

may be formed on separate chips and then packaged together to form a stacked-chip memory device.

In one embodiment, a stripe controller 170 controls a stripe 150 of bays 160, while a bay controller 175 controls each bay 160 individually. Each of the stripe controller 170 and the bay controller 175 may be implemented as a field programmable gate array, application specific integrated circuit, or a combination of them. Detailed implementations and operations of the stripe controller 170 and the bay controller 175 are described below with respect to FIGS. 3 through 10 below.

The memory controller 112 is an interface circuit that interfaces with the external host processor and internal components of the memory device 115 (e.g., the stripe controller 170 and the bay controller 175). The memory controller 112 may be coupled to the host processor through a bus. In addition, the memory controller 112 may be coupled to the stripe controller 170 and the bay controller 175 through conductive wires or traces on a printed circuit board or a flexible circuit board. For the writing operation, the memory controller 112 may receive electronic data to be stored, a target address of the memory array 120, and an instruction to store the electronic data from the host processor. In response to the instruction to store the electronic data, the memory controller 112 may configure the stripe controller 170 and the bay controller 175 to store the electronic data at the target address. For the reading operation, the memory controller 112 may receive a target address of the memory array 120, and an instruction to read the electronic data stored by memory cells associated with the target address from the host processor. In response to the instruction to read, the memory controller 112 configures the stripe controller 170 and the bay controller 175 to retrieve the electronic data stored by the target address and to output the retrieved data to the host processor.

Figure 2:
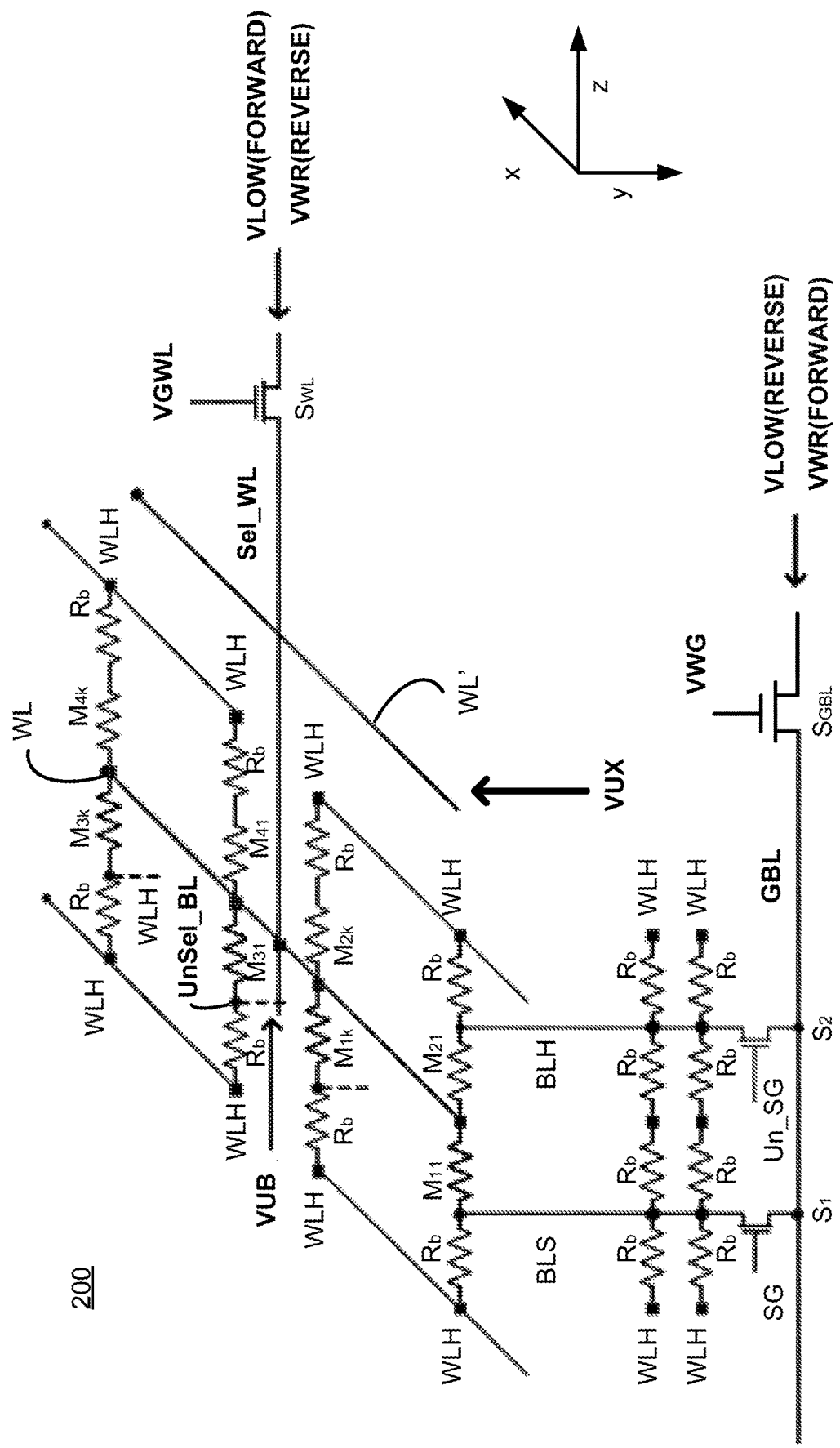
FIG. 2 is a circuit diagram of example memory cells according to an example embodiment.

Referring to FIG. 2, illustrated is a circuit diagram of example memory cells 200, according to an example embodiment. The memory cells 200 may be memory cells in a portion of the bay 160 of FIG. 1. The memory cells 200 may be memory cells of a resistive memory device. The memory cells 200 include a plurality of memory cells $M_{11} \ldots M_{1k}$, $M_{21} \ldots M_{2k}$, and $M_{31} \ldots M_{3k}$, and $M_{41} \ldots M_{4k}$. A resistance value of each memory cell M can be adjusted to store input data. For example, a low resistance of a memory cell M below a threshold resistance may represent a value '0' and a high resistance of the memory cell M above the threshold resistance may represent a value '1.'

In some embodiments, the memory cells M have first ends coupled to a word line WL extending along a x-direction and second ends coupled to corresponding bit lines BLS or BLH extending along a y-direction. Each of the bit lines may be coupled to a plurality of feed resistors $R_b$, through which a voltage can be applied. Each second end of the bit line may be coupled to a switch S. The switch S is an electrical circuit that selectively couples a bit line extending along a y-direction to a global bit line GBL extending along a z-direction. The switch S may be embodied as a transistor (e.g., thin film transistor). For example, in response to a voltage SG (e.g., a voltage corresponding to logic '1') applied to a gate terminal of the switch S, the switch S electrically couples the bit line to the global bit line GBL, and in response to a voltage Un_SG (e.g., a voltage corresponding to logic '0') applied to a gate terminal of the switch S, the switch S electrically decouples the bit line from the global bit line GBL. The voltages SG and Un_SG are control signals for controlling the switches S. The voltages SG and Un_SG may be generated by a driving circuit (e.g., stripe controller 170 or bay controller 175). Unselected bit lines UnSel-BL may be applied with a voltage VUB. The voltage VUB is a voltage applied to an unselected bit line. The voltage VUB may be generated by a driving circuit (e.g., stripe controller 170 or bay controller 175).

Although not shown for simplicity, additional memory cells, bit lines, feed resistors and switches S may be added between another word line WL' extending along the x-direction and the global bit line GBL extending along the z-direction. For example, feed resistor $R_b$, additional memory cells, and another feed resistor $R_b$ may be coupled to the feed resistor $R_b$, memory cells $M_{11}$, $M_{21}$, and another feed resistor $R_b$ in series, with the word line WL' coupled between the additional memory cells. In some embodiments, additional bit lines, feed resistors $R_b$ and switches S may be coupled to corresponding ends of the additional memory cells and the global bit line GBL, in a similar manner as the bit lines, the feed resistors $R_b$ and switches S coupled to corresponding ends of the memory cells $M_{11}$, $M_{21}$ and the global bit line GBL.

In some embodiments, the word line WL is coupled to a switch $S_{WL}$, through which a voltage can be provided. Different word line WL' may be coupled to another switch (not shown). The switch $S_{WL}$ is an electrical circuit that selectively couples the word line WL to a driving circuit (e.g., stripe controller 170 or bay controller 175). The switch $S_{WL}$ may be embodied as a transistor (e.g., thin film transistor). For example, in response to a signal VGWL having a voltage corresponding to logic '1' applied to a gate terminal of the switch $S_{WL}$, the switch $S_{WL}$ electrically couples the word line WL to the driving circuit, and in response to the signal VGWL having different voltage corresponding to logic '0' applied to the gate terminal of the switch $S_{WL}$, the switch $S_{WL}$ electrically decouples the word line WL from the driving circuit. The signal VGWL is a control signal for controlling the switch $S_{WL}$. The signal VGWL may be generated by a driving circuit (e.g., stripe controller 170 or bay controller 175). When the word line WL is selected (i.e., or is coupled to the driving circuit), a signal VLOW or VWR may be supplied to the word line WL. The signals VLOW and VWR are signals applied to memory cells M for changing resistance values. The signals VLOW and VWR may be generated by a driving circuit (e.g., stripe controller 170 or bay controller 175). During a set operation to change a high resistance value of a memory cell to a low resistance value, the signal VWR may be applied to the selected word line WL, and the signal VLOW may be applied to the global bit line GBL. During a reset operation to change the low resistance value of the memory cell to the high resistance value, the signal VLOW may be applied to the selected word line WL, and the signal VWR may be applied to the global bit line GBL. When the word line WL is not selected (i.e., not coupled to the driving circuit), a voltage VUX may be supplied to the word line WL. The voltage VUX is a voltage applied to an unselected word line. The voltage VUX may be generated by a driving circuit (e.g., stripe controller 170 or bay controller 175).

In some embodiments, the global bit line GBL is coupled to a switch $S_{GBL}$, through which a voltage can be provided. The switch $S_{GBL}$ is an electrical circuit that selectively couples the global bit line GBL to a driving circuit (e.g., stripe controller 170 or bay controller 175). The switch $S_{GBL}$ may be embodied as a transistor (e.g., thin film transistor). For example, in response to a signal VWG having a voltage corresponding to logic '1' applied to a gate terminal of the switch $S_{GBL}$, the switch $S_{GBL}$ electrically couples the global bit line GBL to the driving circuit, and in response to the signal VWG having a voltage corresponding to logic '0' applied to the gate terminal of the switch $S_{GBL}$, the switch $S_{GBL}$ electrically decouples the global bit line GBL from the driving circuit. The signal VWG is a control signal for controlling the switch $S_{GBL}$. The signal VWG may be generated by a driving circuit (e.g., stripe controller 170 or bay controller 175). When the global bit line GBL is coupled to the driving circuit, a voltage VWR or VLOW may be supplied to the global bit line GBL. When the global bit line GBL is not coupled to the driving circuit, the global bit line GBL may be floated.

Figure 3:
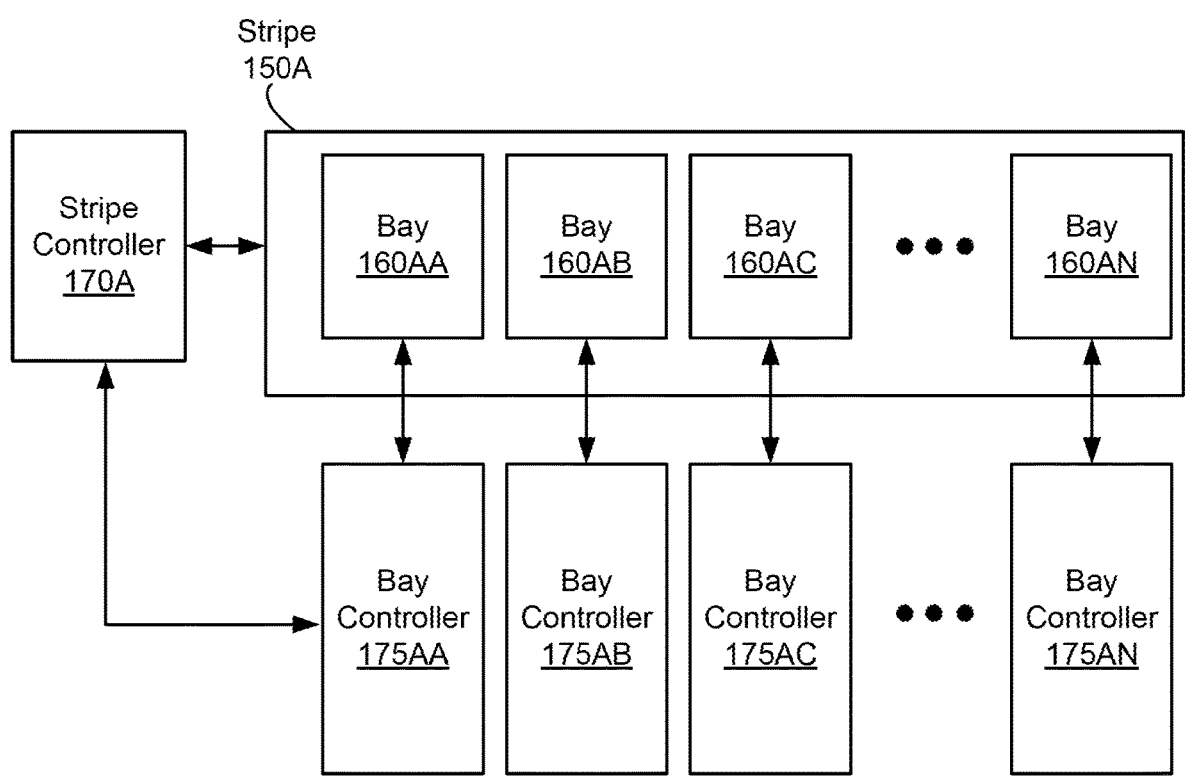
FIG. 3 is a block diagram of controllers controlling bays in a stripe according to an example embodiment.

Referring to FIG. 3, illustrated is a block diagram depicting a stripe controller 170A and bay controllers 175AA, 175AB . . . 175AN, which control bays 160AA, 160AB . . . 160AN in a stripe 150A, according to an example embodiment. Each of the bay controllers 175 is coupled to a corresponding bay 160 through a respective conductive connection. The stripe controller 170A is coupled to each of the bays 160AA-160AN through a common conductive connection, and is coupled to each of the bay controllers 175AA-175AN through another common conductive connection. In this configuration, these components operate together to supply various voltages (e.g., VLOW, VWR, VGWL, VUB, VUX, VWG of FIG. 2) or currents to memory cells in bays. In one aspect, each bay controller 175 can selectively supply a voltage or current to memory cells in a corresponding bay 160 for writing or reading data. The stripe controller 170A may control operations of the bay controllers 175 or directly provide a voltage or current to the bays 160.

Figure 4:
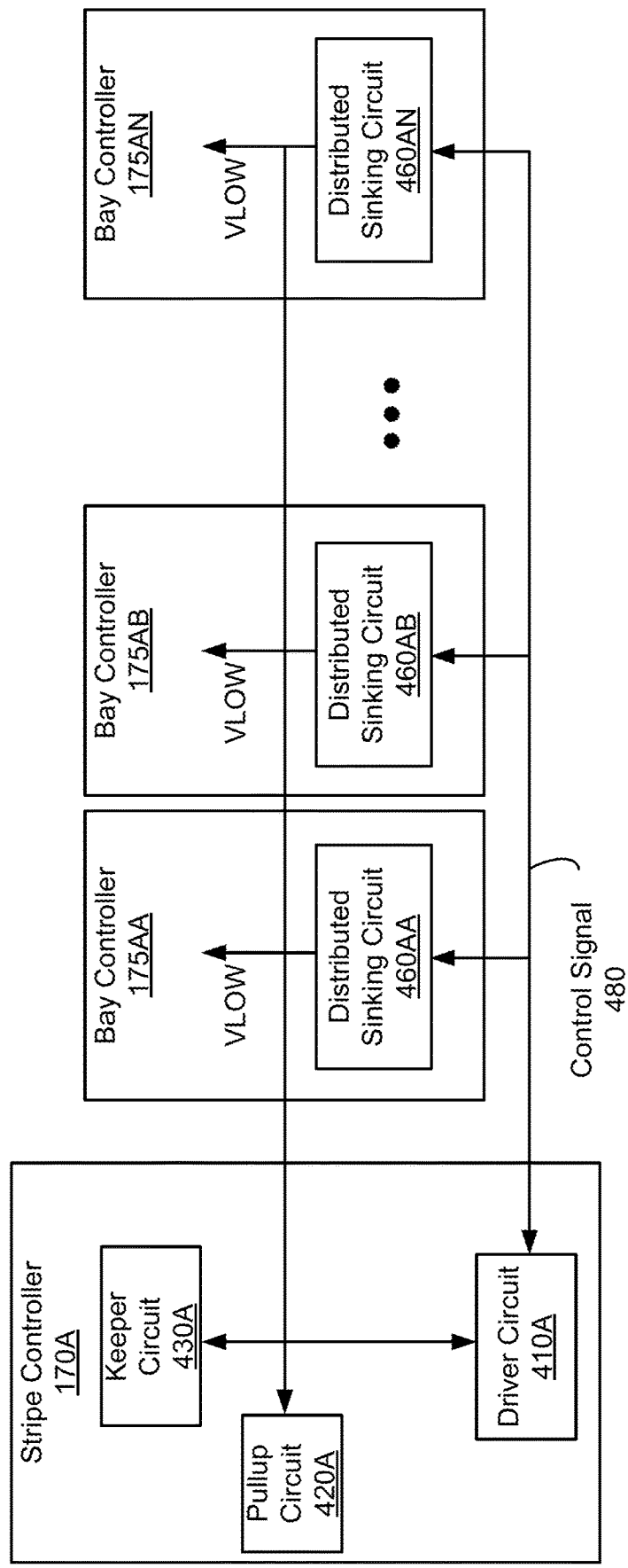
FIG. 4 is a block diagram of a stripe controller and bay controllers according to an example embodiment.

Referring to FIG. 4, illustrated is a block diagram of a stripe controller 170A and bay controllers 175AA-175AN for generating voltages (e.g., VLOW) for selected word lines or selected bit lines according to an example embodiment. In some embodiments, the stripe controller 170A is coupled to the bay controllers 175AA-175AN through conductive lines. Through the conductive lines, the stripe controller 170A provides a control signal 480 to one or more bay controllers 175, and receives a voltage (e.g., VLOW) at the output of the bay controllers 175 in response. A control signal 480 is a signal indicative of a target voltage or a target current to be provided to memory cells. The bay controller 175 receives the control signal 480 from the stripe controller 170A, and provides voltages (e.g., VLOW) to corresponding memory cells, according to the control signal 480. The bay controller 175 may also provide the voltages (e.g., VLOW) to the stripe controller 170 for feedback operation.

In some embodiments, the bay controller 175 includes a distributed sinking circuit 460. In one aspect, the distributed sinking circuit 460 is a means for configuring memory cells according to the control signal 480. The distributed sinking circuit 460 is a circuit having an output coupled to corresponding memory cells to supply a voltage (e.g., VLOW, etc.) to the coupled memory cells to sink current. The distributed sinking circuit 460 may receive the control signal 480, and generate the voltage (e.g., VLOW) according to the control signal 480. The distributed sinking circuit 460 may supply the voltage (e.g., VLOW) to corresponding memory cells to sink current. In one aspect, the distributed sinking circuit 460 supplies a voltage having varying levels with a short settling time (e.g., 100 ns) to sink a large amount of current (e.g., 350 uA). Because each distributed sinking circuit 460 is local to a corresponding bay controller 175, voltage with different levels can be provided to the memory cells with a short settling time.

In some embodiments, the stripe controller 170A includes a driver circuit 410A, a pull up circuit 420A, and a keeper circuit 430A. The driver circuit 410A, the pull up circuit 420A, and the keeper circuit 430A are coupled to each other to output of the distributed sinking circuit 460 through one or more conductive lines (or traces). The driver circuit 410A generates a control signal 480 to configure one or more of the distributed sinking circuits 460 to provide voltages or current to corresponding memory cells. The pullup circuit 420A pulls up the voltage at the memory cells or outputs of the distributed sinking circuits 460. The keeper circuit 430A sources current to the output of the distributed sinking circuit 460, for example, when current through the memory cells is low to maintain close loop regulation. These components operate together to perform fast sourcing or fast sinking at the memory cells to provide the voltage (e.g., VLOW) at varying levels during different time periods.

The driver circuit 410A may be any circuit that generates a control signal based on a received signal. In an implementation, the driver circuit 410A is a circuit that receives the voltage at the output of the distributed sinking circuit 460 and generates the control signal 480 based on the received voltage to cause the voltage (e.g., VLOW) at the output of the distributed sinking circuit 460 to be at a target voltage level. For example, if the voltage (e.g., VLOW) at the output of the distributed sinking circuit 460 is lower than the target voltage level, then the driver circuit 410A generates the control signal 480 to cause the distributed sinking circuit 460 to increase the voltage at the output. For another example, if the voltage (e.g., VLOW) at the output of the distributed sinking circuit 460 is higher than the target voltage level, then the driver circuit 410A generates the control signal 480 to cause the distributed sinking circuit 460 to decrease the voltage at the output. Through the feedback operation, the driver circuit 410A can regulate the output of the distributed sinking circuit 460 to be at a target level. Detailed implementations and operations of the driver circuit 410 are described below with respect to FIGS. 6 through 10.

The pull up circuit 420A is a circuit that pulls up the voltage (e.g., VLOW) at the output of the distributed sinking circuit 460. In one example, the pull up circuit 420A includes an opamp circuit to perform fast pull up. The pull up circuit 420 may pull up the voltage (e.g. VLOW) at the output of the distributed sinking circuit 460, when the distributed sinking circuits 460 are disabled, for example, in the initial phase.

The keeper circuit 430A is a circuit that sources current to the output of the distributed sinking circuit 460. The keeper circuit 430A may inject current when current through the memory cells is low to maintain close loop regulation.

Figure 5:
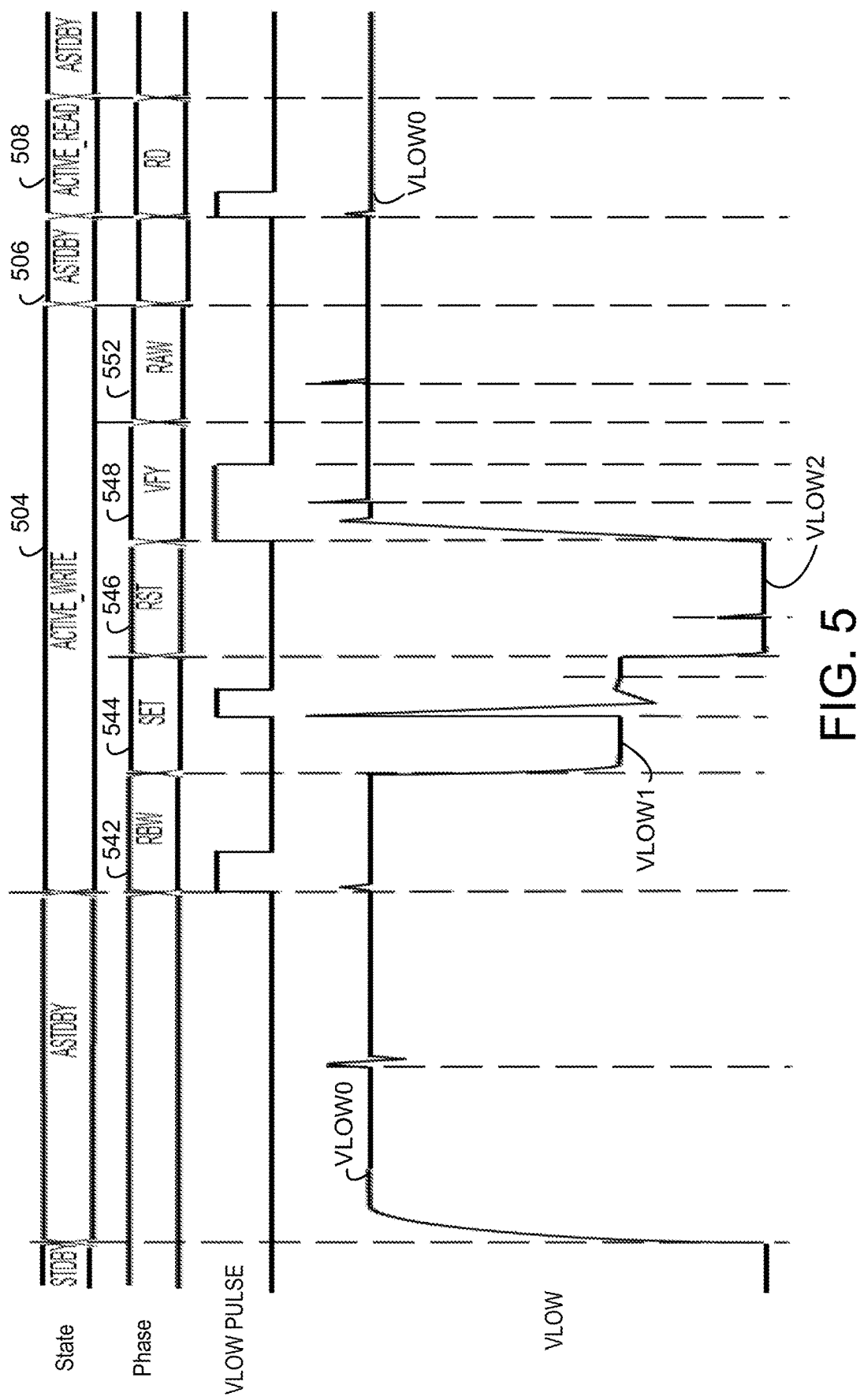
FIG. 5 is an example timing diagram of voltages applied to memory cells according to an example embodiment.

Referring to FIG. 5, illustrated is an example timing diagram of voltages applied to memory cells according to an example embodiment. In one embodiment, the memory device 115 performs a write operation 504 and a read operation 508 at different time periods. The memory device 115 may be in standby 506 between the write operation 504 and the read operation 508. In some embodiments, the distributed sinking circuits 460 output a relatively constant voltage (e.g., VLOW0) during the standby 506 and the read operation 508 periods.

In some embodiments, the write operation 504 is performed through different phases: read before write RBW 542, SET 544, reset RST 546, verify VFY 548, and read after write RAW 552. Phases may be changed in response to a VLOW pulse. During different phases, the distributed sinking circuits 460 may output voltages VLOW at varying voltage levels (e.g., VLOW0, VLOW1, VLOW2) to selected memory cells. In one aspect, improving an operation speed of a memory device 115 involves reducing settling time allocated for voltages changing in different phases to settle. Current loads, capacitive loads, or a combination of them may change during different phases, and configuring different voltages to settle within a short settling time (e.g., 100 ns) in different phases may be challenging. By employing the distributed sinking circuit 460 and the stripe controller 170 with the disclosed driver circuit 410, the voltages VLOW with a wide range of voltage levels may be provided to memory cells with a short settling time (e.g., 100 ns).

Figure 6:
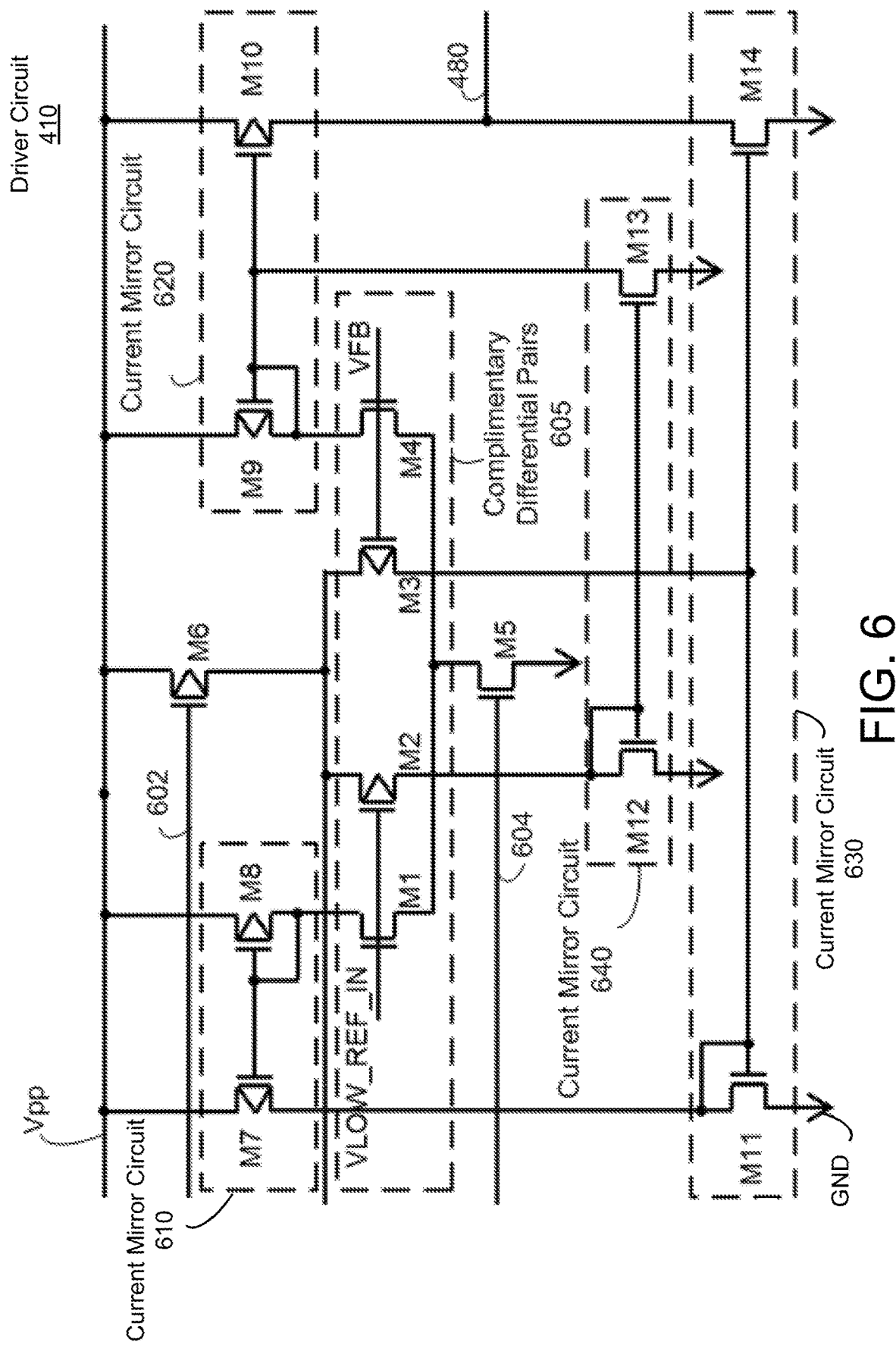
FIG. 6 is a detailed circuit diagram of a driver circuit according to an example embodiment.

Referring to FIG. 6, illustrated is a detailed circuit diagram of a driver circuit 410 according to an example embodiment. In some embodiments, the driver circuit includes transistors M1-M14. The transistors M1, M4, M5, M11-M14 may be N-type transistors, and the transistors M2, M3, M6-M10 may be P-type transistors. P-type transistor may be a PNP transistor or a P-channel MOSFET, where N-type transistor may be an NPN transistor or an N-channel MOSFET. These components operate together to receive a reference signal VLOW_REF_IN and a feedback signal VFB, and generate the control signal 480 as its output. The reference signal VLOW_REF_IN is a signal indicative of a target voltage at the memory cells (or output of the distributed sinking circuit 460). The reference signal VLOW_REF_IN may be generated by the stripe controller 170. The feedback signal VFB is a signal indicative of the voltage (e.g., VLOW) at the memory cells (or output of the distributed sinking circuit 460). In one approach, the voltage (e.g., VLOW) at the memory cells is provided as the feedback signal VFB. In other embodiments, some of P-type transistors shown in FIG. 6 may be implemented by N-type transistors, and some of N-type transistors shown in FIG. 6 may be implemented by P-type transistors.

In one configuration, the driver circuit 410 includes complementary differential pairs 605. The complementary differential pairs 605 include a first differential pair of transistors and a second differential pair of transistors coupled to differential input signals (e.g., signals VLOW_REF_IN and VFB). The first differential pair may be an N-type differential pair including N-type transistors, and the second differential pair may be a P-type differential pair including P-type transistors. The first differential pair includes transistors M1, M4, where source terminals of the transistors M1, M4 are coupled to a drain terminal of the transistor M5. The second differential pair includes transistors M2, M3, where source terminals of the transistors M2, M3 are coupled to a drain terminal of the transistor M6. Gate terminals of the transistors M1, M2 are coupled to a conductive line to receive the reference signal VLOW_REF_IN, and gate terminals of the transistors M3, M4 are coupled to a conductive line to receive the feedback signal VFB. The gate terminals of the transistors M3, M4 may be coupled to memory cells or outputs of the distributed sinking circuits 460.

The transistor M6 operates as a current source that supplies current to the differential pair of the transistors M2, M3. The transistor M6 includes a source terminal coupled to a first voltage rail to receive a supply voltage (e.g., Vpp) or an external supply voltage, a gate terminal coupled to a conductive line to receive a bias signal 602, and the drain terminal coupled to the source terminals of the transistors M2, M3. The bias signal 602 is a signal indicative of a target current flow through the transistor M6. The bias signal 602 may be generated by the stripe controller 170. The transistor M6 may supply current to the differential pair of the transistors M2, M3, according to a voltage at the bias signal 602.

Similarly, the transistor M5 operates as a current source that supplies current to the differential pair of the transistors M1, M4. The transistor M5 includes a source terminal coupled to a second voltage rail to receive a supply voltage (e.g., GND), a gate terminal coupled to a conductive line to receive a bias signal 604, and the drain terminal coupled to the source terminals of the transistors M1, M4. The bias signal 604 is a signal indicative of a target current flow through the transistor M5. The bias signal 604 may be generated by a balance controller 170. The transistor M5 may supply current to the differential pair of the transistors M1, M4, according to a voltage at the bias signal 604.

In this configuration, the differential pair of the transistors M1, M4 receives current from the transistor M5 and steers the current according to a difference in the voltage between the reference signal VLOW_REF_IN and the feedback signal VFB. For example, if the voltage of the reference signal VLOW_REF_IN is higher than the voltage of the feedback signal VFB, the differential pair of the transistors M1, M4 steers more current through the drain terminal of the transistor M1 than the drain terminal of the transistor M4. For another example, if the voltage of the reference signal VLOW_REF_IN is less than the voltage of the feedback signal VFB, the differential pair of the transistors M1, M4 steers more current through the drain terminal of the transistor M4 than the drain terminal of the transistor M1.

Similarly, the differential pair of the transistors M2, M3 receives current from the transistor M6 and steers the current according to a difference in the voltage between the reference signal VLOW_REF_IN and the feedback signal VFB. For example, if the voltage of the reference signal VLOW_REF_IN is higher than the voltage of the feedback signal VFB, the differential pair of the transistors M2, M3 steers more current through the drain terminal of the transistor M3 than the drain terminal of the transistor M2. For another example, if the voltage of the reference signal VLOW_REF_IN is less than the voltage of the feedback signal VFB, the differential pair of the transistors M2, M3 steers more current through the drain terminal of the transistor M2 than the drain terminal of the transistor M3.

The transistors M7-M14 operate as current mirror circuits that receive currents from the complementary differential pairs 605 and generate the control signal 480 at an output of the driver circuit 410. Specifically, the transistors M7, M8 form a current mirror circuit 610, the transistors M9, M10 form a current mirror circuit 620, the transistors M11, M14 form a current mirror circuit 630, and the transistors M12, M13 form the current mirror circuit 640. Each current mirror circuit includes a diode connected transistor having a gate terminal coupled to a drain terminal and a mirror transistor having a gate terminal coupled to the gate terminal of the diode connected transistor. For example, current mirror circuit 610 includes the diode connected transistor M8 and the mirror transistor M7. The current mirror circuit receives current at the gate terminal or the drain terminal of the diode connected transistor as its input and outputs a mirrored current of the received current at a drain terminal of the mirror transistor as its output.

In one configuration, the current mirror circuit 610 includes an input (e.g., drain terminal of the transistor M8) coupled to the drain terminal of the transistor M1 of the N-type differential pair, and an output (e.g., drain terminal of the transistor M7) coupled to an input (e.g., drain terminal of the transistor M11) of the current mirror circuit 630. The input (e.g., drain terminal of the transistor M11) of the current mirror circuit 630 is also coupled to the drain terminal of the transistor M3 of the P-type differential pair, where the output (e.g., drain terminal of the transistor M14) of the current mirror circuit 630 is coupled to an output of the driver circuit 410 to provide the control signal 480. In addition, the current mirror circuit 640 includes an input (e.g., drain terminal of the transistor M12) coupled to the drain terminal of the transistor M2 of the P-type differential pair, and an output (e.g., drain terminal of the transistor M13) coupled to an input (e.g., drain terminal of the transistor M9) of the current mirror circuit 620. The input (e.g., drain terminal of the transistor M9) of the current mirror circuit 620 is also coupled to the drain terminal of the transistor M4 of the N-type differential pair, where the output of the current mirror circuit 620 is coupled to the output of the driver circuit 410 and the output (e.g., drain terminal of the transistor M14) of the current mirror circuit 630.

In this configuration, current through the transistor M1 of the N-type differential pair is mirrored by the current mirror circuits 610, 630, where current through the transistor M4 of the N-type differential pair is mirrored by the current mirror circuit 620. In addition, current through the transistor M2 of the P-type differential pair is mirrored by the current mirror circuits 640, 620, where current through the transistor M3 of the P-type differential pair is mirrored by the current mirror circuit 630. Hence, if the voltage of the reference voltage VLOW_REF_IN is higher than a voltage of the feedback signal VFB, then more current flows through the transistor M14 compared to the transistor M10 to decrease a voltage of the control signal 480. If the voltage of the reference voltage VLOW_REF_IN is lower than the voltage of the feedback signal VFB, then more current flows through the transistor M10 compared to the transistor M14 to increase a voltage of the control signal 480. The control signal 480 with an increased voltage may cause the voltage at the output of the memory cells to increase, and the control signal 480 with a decreased voltage may cause the voltage at the output of the memory cells to decrease. Thus, the difference between the voltages of the signals VLOW_REF_IN and the feedback signal VFB may be reduced through feedback operation.

Figure 7A:
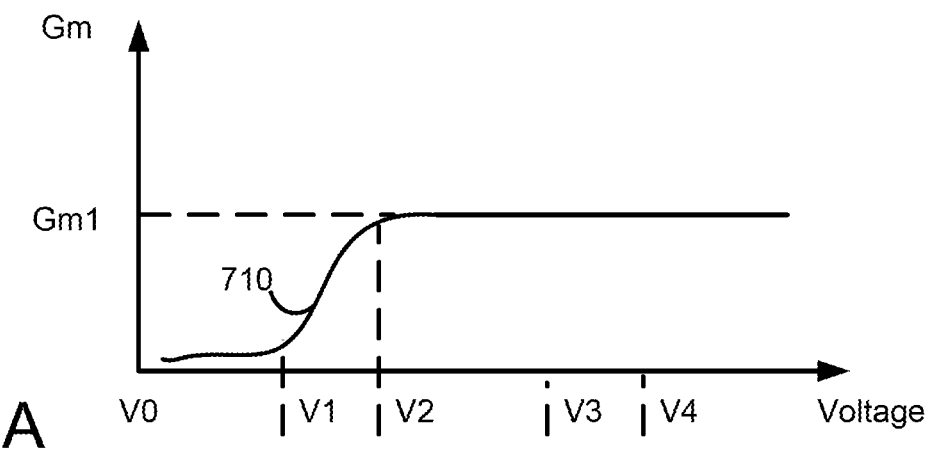
FIG. 7A is an example transconductance plot of an N-type differential pair, according to an example embodiment.
Figure 7B:
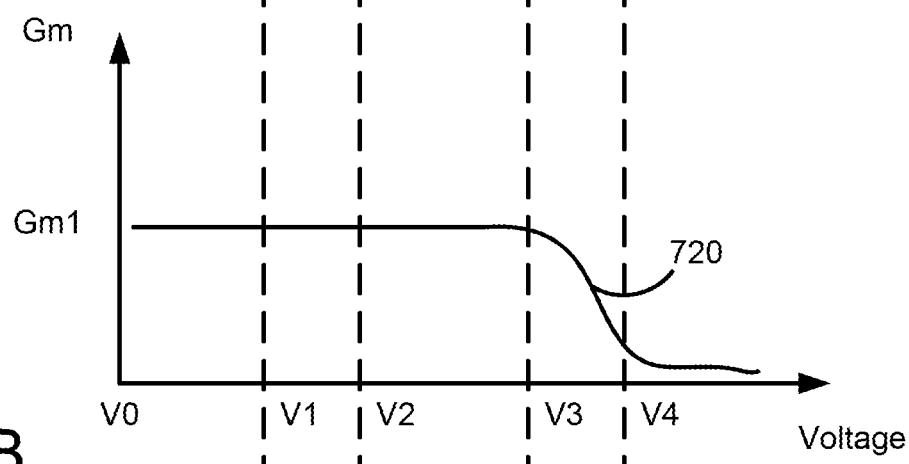
FIG. 7B is an example transconductance plot of a P-type differential pair, according to an example embodiment.
Figure 7C:
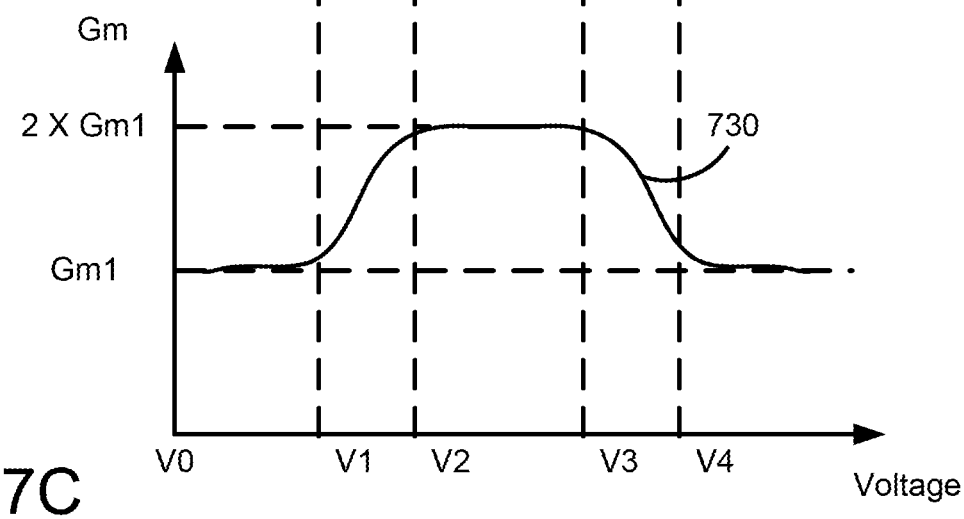
FIG. 7C is an example transconductance plot of a combination of an N-type differential pair and a P-type differential pair, according to an example embodiment.

Referring to FIGS. 7A-7C, illustrated are transconductance plots of complementary differential pairs according an example embodiment. Specifically, FIG. 7 is an example transconductance plot 710 of an N-type differential pair, FIG. 7B is an example transconductance plot 720 of a P-type differential pair, and FIG. 7C is an example transconductance plot 730 of a combination of an N-type differential pair and a P-type differential pair. A transconductance Gm is a ratio between a change in the output current and a change in input voltage. Generally, higher transconductance allows a better sensing capability or an improved sensitivity of a transistor in response to a voltage applied at a gate terminal of the transistor.

In one aspect, implementing the complementary differential pairs 605 allows a range of voltages detectable by the driver circuit 410 to increase. Specifically, the N-type differential pair has a low transconductance for a region between V0 and V1. For a region between voltages V1 and V2, the transconductance of the N-type differential pair increases, and saturates at a level Gm1 after the voltage V2. Thus, the N-type differential pair is inoperable for an input voltage below V2. Conversely, the P-type differential pair has a transconductance at a level Gm1 for a region between V0 and V3. For a region between voltages V3 and V4, the transconductance of the P-type differential pair decreases, and becomes low (near zero) after the voltage V4. Thus, the P-type differential pair is inoperable for an input voltage over V4. By implementing the complementary differential pairs 605 including both N-type differential pair and P-type differential pair, sensing results of the N-type differential pair and the P-type differential pair can be combined. Therefore, the transconductance plots 710, 720 are superpositioned to obtain the transconductance plot 730 of FIG. 7C. Hence, the driving circuit 410 implementing the complementary differential pair 605 can operate for a wider voltage range compared to implementing only the N-type differential pair or only the P-type differential pair.

However, the driving circuit 410 implementing the complementary differential pair 605 may suffer from a stability issue. In particular, for a region between V2 and V3, the transconductance of the complementary differential pair 605 becomes twice of the transconductance below the voltage V1 or after the voltage V4. Such difference in the transconductance may cause a stability issue of the feedback operation between the driving circuit 410 and the distributed sinking circuits 460.

Figure 8:
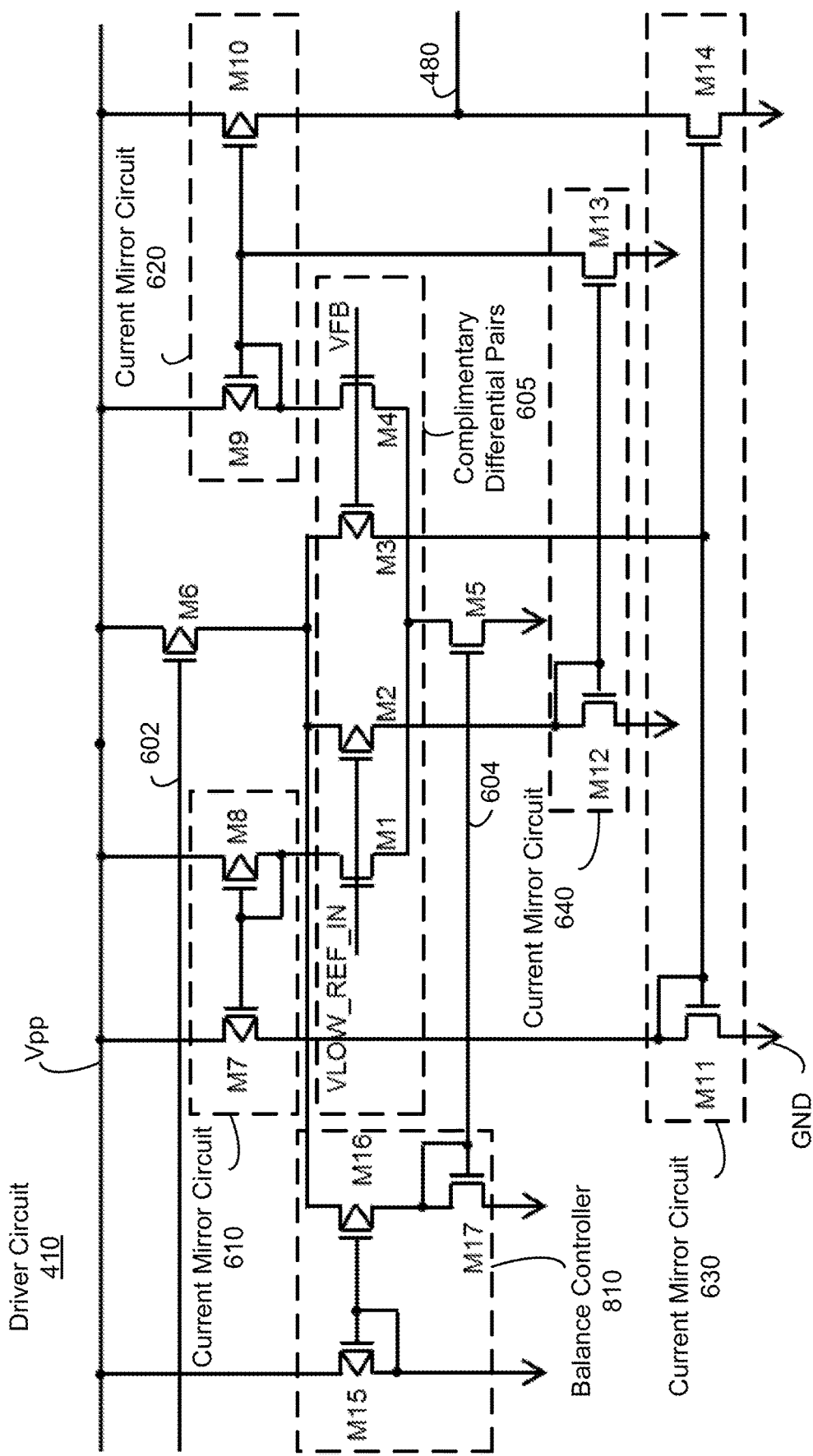
FIG. 8 is a detailed circuit diagram of a driver circuit with a balance controller according to an example embodiment.

Referring to FIG. 8, illustrated is a detailed circuit diagram of a driver circuit 410 with a balance controller 810 according to an example embodiment. In some embodiments, the balance controller 810 includes the transistors M15-M17. The transistors M15, M16 may be P-type transistors, and the transistor M17 may be N-type transistor. These components of the balance controller 810 operate together to balance transconductances of the N-type differential pair and the P-type differential pair. Remaining components of the driving circuit 410 in FIG. 8 is identical to the ones in FIG. 6. Thus, the detailed description thereof is omitted herein for the sake of brevity. In other embodiments, some of P-type transistors shown in FIG. 8 may be implemented by N-type transistors, and some of N-type transistors shown in FIG. 8 may be implemented by P-type transistors.

In one configuration, the transistor M16 includes a source terminal coupled to source terminals of the transistors M2, M3 of the P-type differential pair, a gate terminal coupled to a gate terminal of the transistor M15, and a drain terminal coupled to a drain terminal of the transistor M17. The transistor M17 includes a gate terminal coupled to the drain terminal of the transistor M17, the drain terminal of the transistor M16, and a gate terminal of the transistor M5. The transistor M17 also includes a source terminal coupled to the second voltage rail.

In this configuration, the transistor M16 steers current from the transistor M6, and adjusts current through the transistor M5, according to a voltage of the feedback signal VFB. Specifically, the current through the transistor M6 is split between the transistor M16 and the differential pair of the transistors M2, M3. For example, if a common mode (e.g., average) of the voltage of the signals VLOW_REF_IN and VFB is higher than a voltage at a gate terminal of the transistor M16, then more current flows through the transistor M16 compared to the differential pair of the transistors M2, M3. For another example, if a common mode (e.g., average) of the voltage of the signals VLOW_REF_IN and VFB is less than a voltage at a gate terminal of the transistor M16, then more current flows through the differential pair of the transistors M2, M3 compared to the transistor M16. The transistors M17, M5 operate as a current mirror circuit that mirrors a current from the transistor M16 to generate a current flow through the transistor M5. For example, an increased current through the transistor M16 causes a voltage of the bias signal 604 to increase to cause more current flow through the transistor M5, and a decreased current through the transistor M16 causes the voltage of the bias signal 604 to decrease to cause less current flow through the transistor M5. Hence, an increased current through the differential pair of the transistors M2, M3 renders a decreased current through the differential pair of the transistors M1, M4, and an increased current through the differential pair of the transistors M2, M3 renders a decreased current through the differential pair of the transistors M1, M4.

In one aspect, the balance controller 810 allows the overall transconductance of the complimentary differential pairs 605 to be substantially uniform by steering current from the transistor M6, and adjusting current flow through the transistor M5. Generally, a transconductance is proportional to an amount of DC current. Thus, steering more current through the P-type differential pair of transistors M2, M3 while reducing current through the N-type differential pair of transistors M1, M4 allows a transconductance of the P-type differential pair of transistors M2, M3 to be higher than the N-type differential pair of transistors M1, M4. Similarly, steering less current through the P-type differential pair of transistors M2, M3 while increasing current through the N-type differential pair of transistors M1, M4 allows a transconductance of the P-type differential pair of transistors M2, M3 to be lower than the N-type differential pair of transistors M1, M4. By adjusting the transconductance of the P-type differential pair and the N-type differential pair through the balance controller 810 the overall transconductance of the complimentary differential pairs 605 can be substantially uniform as shown in FIG. 9A, 9B below.

In one aspect, the first differential pair of the transistors M1, M4 is a means for receiving a voltage within a first range, and the second differential pair of the transistors M2, M3 is a means for receiving a voltage within a second range. In another aspect, the balance controller 810 is a means for adjusting a transconductance of the means for receiving the voltage within the first range with respect to the means for receiving the voltage within the second range. In another aspect, the current mirror circuits 610, 620, 630, 640 are means for generating a control signal 480 according to the adjusted transconductance.

Figure 9A:
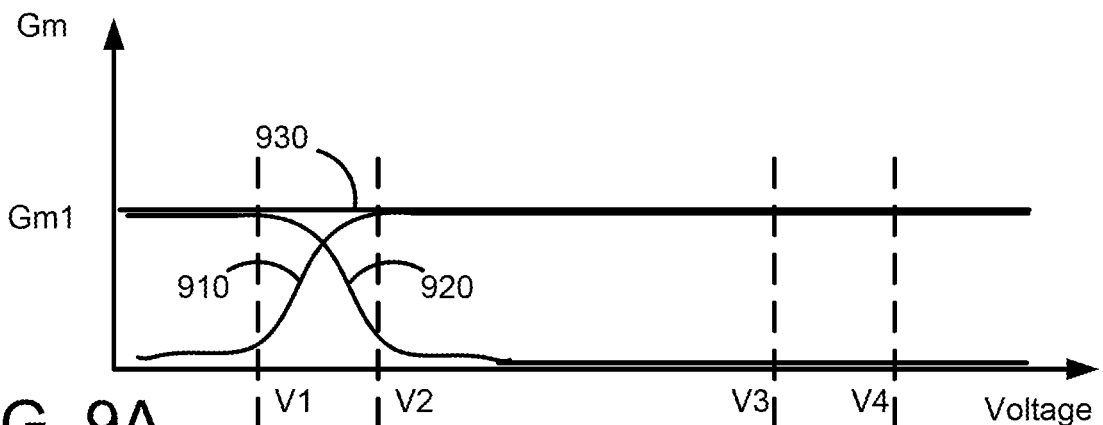
FIG. 9A is an example transconductance plot of a combination of adjusted N-type differential pair and P-type differential pair, according to an example embodiment.

Referring to FIG. 9A, illustrated is an example transconductance plot 930 of a combination of adjusted N-type differential pair and P-type differential pair, according to an example embodiment. In one aspect, the transconductance plot 930 is a combination of the transconductance plots 910 and 920. The transconductance plot 910 shows a transconductance of the N-type differential pair that is similar to the transconductance plot 710 of FIG. 7A and the transconductance plot 920 shows a transconductance of the P-type differential pair that is similar to the transconductance plot 720 of FIG. 7B, except the transconductance of the P-type transistor decreases in a region between voltages V1, V2, and becomes low after the voltage V2 due to the balance controller 810. Hence, the transconductance plot 930 of a combination of adjusted N-type differential pair and P-type differential pair can be substantially uniform.

Figure 9B:
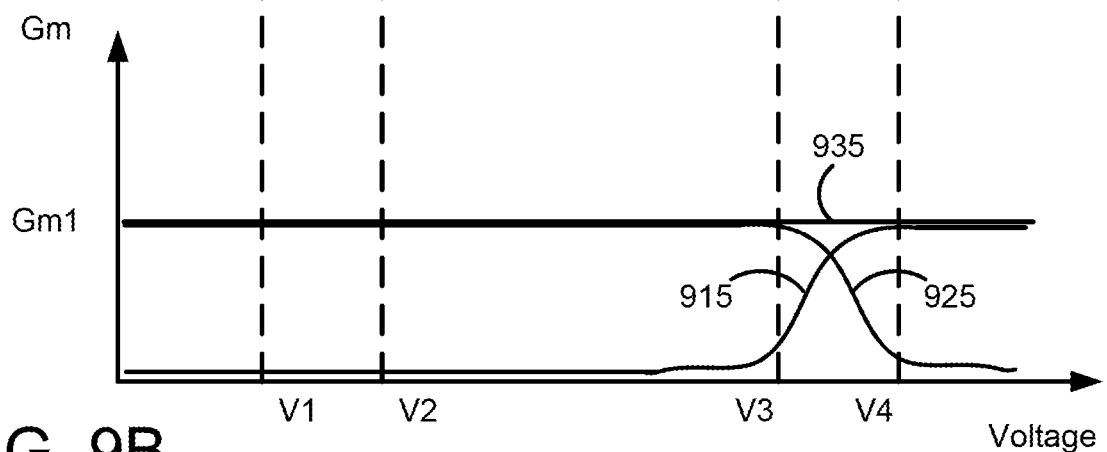
FIG. 9B is another example transconductance plot of a combination of adjusted N-type differential pair and P-type differential pair, according to an example embodiment.

Referring to FIG. 9B, illustrated is an example transconductance plot 935 of a combination of adjusted N-type differential pair and P-type differential pair, according to an example embodiment. In one aspect, the transconductance plot 935 is a combination of the transconductance plots 915 and 925. The transconductance plot 915 shows a transconductance of the N-type differential pair that is similar to the transconductance plot 710 of FIG. 7A and the transconductance plot 925 shows a transconductance of the P-type differential pair that is similar to the transconductance plot 720 of FIG. 7B, except the transconductance of the N-type transistor increases in a region between voltages V3, V4, and becomes saturated after the voltage V4 due to the balance controller 810. Hence, the transconductance plot 935 of a combination of adjusted N-type differential pair and P-type differential pair can be substantially uniform.

In one approach, the region in which the transconductance of the P-type differential pair and the transconductance of the N-type differential pair cross is determined according to a voltage of the bias signal 602 or a current flow through the transistor M15.

Referring to FIG. 10, illustrated is an example flow chart illustrating a process 1000 of automatically adjusting a transconductance and generating a control signal 480 according to an example embodiment. The process 1000 may be performed by the driver circuit 410 of FIG. 8. In other embodiments, the process 1000 may be performed by other components. In other embodiments, the process 1000 may include more, fewer, or different steps than shown in FIG. 10.

The driver circuit 410 receives a voltage at a memory cell based on a first differential pair and a second differential pair in step 1010. The first differential pair may include transistors configured to detect voltages in a first range, and the second differential pair may include transistors configured to detect voltages in a second range. In one approach, a gate terminal of a transistor of the first differential pair and a gate terminal of a transistor of the second differential pair may be coupled to each other to receive a reference signal VLOW_REF_IN, and a gate terminal of another transistor of the first differential pair and a gate terminal of another transistor of the second differential pair may be coupled to each other to receive a feedback signal VFB. The feedback signal VFB may be indicative of a voltage at an output of the distributed sinking circuit coupled to corresponding memory cells.

The driver circuit 410 adjusts a transconductance of the first differential pair with respect to the second differential pair according to the voltage in step 1020. For example, if a common mode (e.g., average) of the voltage of the signals VLOW_REF_IN and VFB is within a first voltage range, e.g., higher than voltage V4, then the balance controller 810 of the driver circuit 410 increases a transconductance of the first differential pair of the transistors M1, M4, decreases a transconductance of the second differential pair of the transistors M2, M3 or both. For example, if a common mode (e.g., average) of the voltage of the signals VLOW_REF_IN and VFB is within a second voltage range, e.g., less than voltage V2, then the balance controller 810 of the driver circuit 410 increases a transconductance of the second differential pair of the transistors M2, M3, decreases a transconductance of the first differential pair of the transistors M1, M4 or both.

The driver circuit 410 generates a control signal according to the adjusted transconductance in step 1030. The control signal is a signal indicative of a target voltage level of an output of the distributed sinking circuit. Based on the control signal, the distributed sinking circuit changes the voltage at its output. In return, the driver circuit 410 receives a feedback signal VFB indicative of the output of the distributed sinking circuit. Through feedback operation by monitoring the feedback signal VFB and adjusting the control signal, the driver circuit 410 can cause the output of the distributed sinking circuit to be at the target voltage level. Because the transconductance is adjusted, stability of feedback operation for detecting the output of the distributed sinking circuit and generating the control signal may be improved.

The preceding description is directed to certain implementations for the purposes of describing the innovative aspects of this disclosure. However, a person having ordinary skill in the art will readily recognize that the teachings herein can be applied in a multitude of different ways. The described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, wearable devices, clocks, calculators, television monitors, flat panel displays, electronic reading devices (such as e-readers), computer monitors, auto displays (such as odometer and speedometer displays), cockpit controls and displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, in addition to non-EMS applications), aesthetic structures (such as display of images on a piece of jewelry or clothing) and a variety of EMS devices.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, directional terms are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A device comprising:
   a distributed sinking circuit to sink current from a memory cell; and
   a driver circuit coupled to the distributed sinking circuit, the driver circuit comprising:
   a first differential pair configured to receive a voltage at the memory cell across a first voltage range; and
   a second differential pair configured to receive the voltage at the memory cell across a second voltage range, wherein the driver circuit is configured to generate a control signal based on the received voltage to change the current from the memory cell.

2. The device of claim 1, further comprising:
a balance controller coupled to the first differential pair and the second differential pair, the balance controller configured to:
   increase a transconductance of the first differential pair with respect to the second differential pair in response to the voltage at the memory cell being in the first voltage range, and
   decrease the transconductance of the first differential pair with respect to the second differential pair in response to the voltage at the memory cell being in the second voltage range.

3. The device of claim 2, wherein the balance controller includes:
a steering transistor having a source terminal coupled to source terminals of the second differential pair, and
a diode connected transistor having a gate terminal coupled to:
   a drain terminal of the steering transistor, and
   a gate terminal of a current control transistor coupled to source terminals of the first differential pair.

4. The device of claim 1, wherein:
the first differential pair is an N-type differential pair, and
the second differential pair is a P-type differential pair.

5. The device of claim 4, further comprising:
a first P-type current mirror circuit, an input of the first P-type current mirror circuit coupled to a first N-type transistor of the N-type differential pair;
a second P-type current mirror circuit, an input of the second P-type current mirror circuit coupled to a second N-type transistor of the N-type differential pair;
a first N-type current mirror circuit, an input of the first N-type current mirror circuit coupled to a first P-type transistor of the P-type differential pair; and
a second N-type current mirror circuit, an input of the second N-type current mirror circuit coupled to a second P-type transistor of the P-type differential pair.

6. The device of claim 5, wherein:
the input of the second N-type current mirror circuit is coupled to an output of the first P-type current mirror circuit; and
the input of the second P-type current mirror circuit is coupled to an output of the first N-type current mirror circuit.

7. The device of claim 6, wherein:
an output of the second N-type current mirror circuit is coupled to an output of the second P-type current mirror circuit to output the control signal.

8. The device of claim 1, further comprising:
a pull up circuit coupled to:
   the memory cell,
   a gate terminal of a transistor of the first differential pair, and
   a gate terminal of a transistor of the second differential pair,
wherein the pull up circuit is configured to increase a voltage of the memory cell, while the distributed sinking circuit is disabled.

9. A method comprising:
receiving a voltage at a memory cell based on a first differential pair configured to receive the voltage within a first voltage range and a second differential pair configured to receive the voltage within a second voltage range;
adjusting a transconductance of the first differential pair with respect to the second differential pair according to the voltage at the memory cell; and
generating a control signal according to the adjusted transconductance of the first differential pair with respect to the second differential pair.

10. The method of claim 9, further comprising:
combining sensing results of the first differential pair and the second differential pair to generate the control signal.

11. The method of claim 9, further comprising:
increasing the transconductance of the first differential pair with respect to the second differential pair in response to determining that the voltage at the memory cell is within the first voltage range; and
decreasing the transconductance of the first differential pair with respect to the second differential pair in response to determining that the voltage at the memory cell is within the second voltage range.

12. A device comprising:
means for receiving a voltage within a first voltage range;
means for receiving the voltage within a second voltage range;
means for adjusting a transconductance of the means for receiving the voltage within the first voltage range with respect to the means for receiving the voltage within the second voltage range;
means for generating a control signal according to the adjusted transconductance; and
means for supplying a voltage to memory cells according to the control signal.

* * * * *